United States Patent
Lai et al.

(10) Patent No.: US 10,516,393 B2
(45) Date of Patent: Dec. 24, 2019

(54) POWER ON RESET CIRCUIT

(71) Applicant: Winbond Electronics Corp., Taichung (TW)

(72) Inventors: Jyun-Yu Lai, Taichung (TW); Hsing-Yu Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/983,069

(22) Filed: May 17, 2018

(65) Prior Publication Data
US 2019/0296736 A1 Sep. 26, 2019

(30) Foreign Application Priority Data
Mar. 22, 2018 (CN) .......................... 2018 1 0238781

(51) Int. Cl.
*H03L 7/06* (2006.01)
*H03K 17/22* (2006.01)
*H03K 19/20* (2006.01)

(52) U.S. Cl.
CPC ............. *H03K 17/22* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 4,409,501 A | 10/1983 | Eickerman et al. | |
| 4,607,178 A * | 8/1986 | Sugie | H03K 17/223 327/143 |
| 5,528,182 A * | 6/1996 | Yokosawa | H03K 17/223 327/143 |
| 5,631,867 A * | 5/1997 | Akamatsu | G11C 5/147 365/189.09 |
| 5,744,990 A * | 4/1998 | Burstein | H03K 17/223 327/143 |
| 5,847,586 A * | 12/1998 | Burstein | H03K 17/223 327/143 |
| 5,929,672 A * | 7/1999 | Mitani | H03K 17/223 327/143 |
| 6,509,768 B2 | 1/2003 | Polizzi et al. | |
| 6,556,058 B2 | 4/2003 | Ohbayashi et al. | |

(Continued)

FOREIGN PATENT DOCUMENTS

TW 201626722 7/2016

OTHER PUBLICATIONS

"Office Action of Taiwan Counterpart Application", dated Jul. 24, 2018, p. 1-p. 6.

*Primary Examiner* — Lincoln D Donovan
*Assistant Examiner* — Khareem E Almo
(74) *Attorney, Agent, or Firm* — JCIPRNET

(57) ABSTRACT

A power on reset circuit includes a first inverting circuit, a second inverting circuit, a charging apparatus, an output buffer, a current drainer, and a first capacitor. The first inverting circuit and the second inverting circuit are coupled between a voltage detection end and a signal control end in opposite directions. The current drainer drains a current from the voltage detection end according to a power voltage and a voltage on the signal control end. The charging apparatus charges the voltage detection end according to the voltage on the signal control end. The output buffer generates a reset signal according to the voltage on the signal control end.

13 Claims, 4 Drawing Sheets

(56) References Cited

U.S. PATENT DOCUMENTS

| | | | |
|---|---|---|---|
| 6,784,705 B2 | 8/2004 | Kamata | |
| 8,253,452 B2* | 8/2012 | Kushnarenko | G05F 3/30 |
| | | | 327/143 |
| 8,508,264 B1 | 8/2013 | Wang et al. | |
| 8,797,072 B2 | 8/2014 | Shrivastava et al. | |
| 8,803,580 B2 | 8/2014 | Shi et al. | |
| 2010/0194453 A1* | 8/2010 | Kadowaki | H03K 17/223 |
| | | | 327/143 |
| 2014/0084972 A1* | 3/2014 | Nakamura | H03K 17/223 |
| | | | 327/143 |
| 2014/0097873 A1* | 4/2014 | Shi | H03K 17/223 |
| | | | 327/90 |
| 2018/0019661 A1* | 1/2018 | Gao | G06F 1/04 |

* cited by examiner

POWER ON RESET CIRCUIT

CROSS-REFERENCE TO RELATED APPLICATION

This application claims the priority benefit of China application serial no. 201810238781.6, filed on Mar. 22, 2018. The entirety of the above-mentioned patent application is hereby incorporated by reference herein and made a part of this specification.

BACKGROUND

Technical Field

The present disclosure relates to a power on reset circuit, and particularly to a power on reset circuit capable of effectively generating reset signal.

Description of Related Art

Power on reset (POR) circuit plays an important role in integrated circuit. The POR circuit is configured to detect changing state of power voltage and generate reset signal in the process where the power voltage is activated or re-activated such that a logic circuit in the integrated circuit can perform resetting operation (initialization), thereby avoiding occurrence of malfunction.

In conventional technical field, in the operation process of integrated circuit, due to different factors such as noise interference or excessive load, power voltage may not be stable. In terms of requirement, when power voltage drops below a predetermined voltage level and rises again, the POR circuit needs to operate and generates effective reset signal. Meanwhile, when the power voltage is dropped below the predetermined voltage level, the POR circuit is not suitable for generating an effective reset signal. Therefore, it is an important issue for designers of the field to find out how to design a suitable and effective reset signal corresponding to the change of power voltage.

SUMMARY

The disclosure provides a power on reset circuit capable of effectively generating a reset signal.

A power on reset circuit of the disclosure includes a first inverting circuit, a second inverting circuit, a charging apparatus, an output buffer, a current drainer and a first capacitor. The first inverting circuit has an input end coupled to a voltage detection end. An output end of the first inverting circuit is coupled to a signal control end. The second inverting circuit has an input end coupled to the signal control end, and the second inverting circuit has an output end coupled to the voltage detection end. The current drainer is coupled to the voltage detection end, and drains a current from the voltage detection end according to power voltage and a voltage on the signal control end. The charging apparatus is coupled to the voltage detection end and charges the voltage detection end according to the voltage on the signal control end. The output buffer is coupled to the signal control end, and generates a reset signal according to the voltage on the signal control end. The first capacitor is coupled between the voltage detection end and the power voltage.

Based on the above, the disclosure provides the charging apparatus which charges the voltage detection end when the power voltage is changed, which facilitates the voltage on the signal control end to be effectively decreased. In this manner, the output buffer can effectively generate reset signal and reduce possibility of reset operation failure.

To make the foregoing features and advantages of the present invention clearer and more comprehensible, embodiments are described below in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
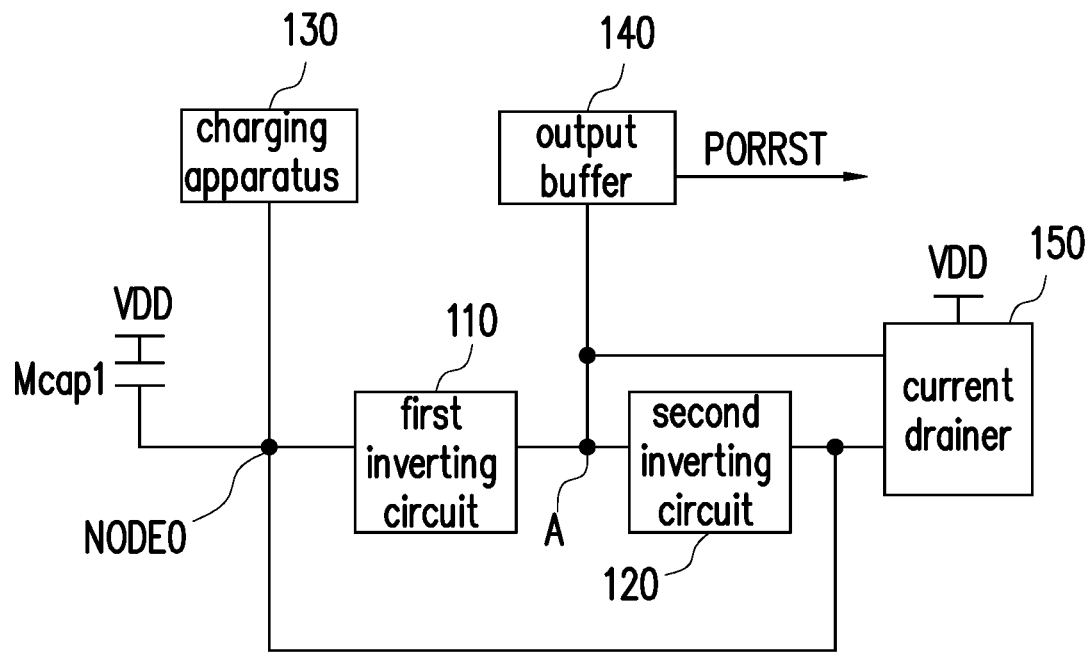
FIG. 1 is a schematic view of a power on reset circuit according to an embodiment of the disclosure.

Referring to FIG. 1, which illustrates a schematic view of a power on reset circuit according to an embodiment of the disclosure. A power on reset circuit 100 includes a first inverting circuit 110, a second inverting circuit 120, a charging apparatus 130, an output buffer 140, a current drainer 150 and a capacitor Mcap1. An input end of the first inverting circuit 110 is coupled to a voltage detection end NODE0, and an output end of the first inverting circuit 110 is coupled to a signal control end A. An input end of the second inverting circuit 120 is coupled to the signal control end A, and the output end of the second inverting circuit 120 is coupled to the voltage detection end NODE0. In other words, the first inverting circuit 110 and the second inverting circuit 120 are coupled between the voltage detection end NODE0 and the signal control end A in opposite directions. The charging apparatus 130 is coupled to the voltage detection end NODE0, and charges the voltage detection end NODE0 according to the voltage on the signal control end A. The output buffer 140 is coupled to the signal control end A, and generates a reset signal PORRST according to the voltage on the signal control end A. The capacitor Mcap1 is coupled between the power voltage VDD and the voltage detection end NODE0. The current drainer 150 is coupled to the voltage detection end NODE0, and receives voltage on the signal control end A and the power voltage VDD.

When the power voltage VDD is activated, the voltage value of the power voltage VDD rises to high voltage from low voltage. In the process that the power voltage VDD rises, the voltage on the voltage detection end NODE0 may be risen along with the increased power voltage VDD. When the voltage on the voltage detection end NODE0 is not greater than the threshold voltage of the first inverting circuit 110, the voltage on the signal control end A is risen along with the increased power voltage VDD.

When the voltage on the voltage detection end NODE0 is greater than the threshold voltage of the first inverting circuit 110, the voltage on the signal control end A is subject to the operation of the first inverting circuit 110 and decreased to be low voltage (e.g., equal to reference ground voltage). In the meantime, the output buffer 140 may, for example, generate the reset signal PORRST of logic high level according to the voltage equal to reference ground voltage on the signal control end A.

In the embodiment, the output buffer 140 may generate the reset signal PORRST according to the voltage on an opposite signal control end A.

When the voltage on the signal control end A is low voltage level, the current drainer 150 starts to activate the function of draining current, and performs current draining operation on the voltage detection end NODE0 while making the voltage detection end NODE0 to perform discharging operation. When the power voltage VDD rises to the voltage level that is high enough, the charging operation performed by the charging apparatus 130 on the voltage detection end NODE0 is stopped, and the discharging operation that is performed by the current drainer 150 on the voltage detection end NODE0 is accelerated. In this manner, the voltage on the voltage detection end NODE0 is decreased according to the discharging operation, and the voltage on the signal control end A is changed into high voltage. Meanwhile, the output buffer 140 generates, for example, the reset signal PORRST of low voltage level according to a voltage equal to high voltage on the signal control A.

It should be indicated that, when the voltage on the signal control end A is changed into high voltage, the discharging operation performed by the current drainer 150 on the voltage detection end NODE0 is terminated.

In the subsequent operation, if the power voltage VDD is dropped, and decreased to a relatively low first voltage, based on that the first inverting circuit 110 performs operation according to power voltage VDD, the decreasing operation of the power voltage VDD causes the voltage generated by the first inverting circuit 110 on the signal control end A to drop correspondingly. Thereafter, if the power voltage VDD rises from the first voltage, the charging apparatus 130 performs charging operation on the voltage detection end NODE0 along with the rising operation of the power voltage VDD, the voltage on the signal control end A is decreased to be low voltage (e.g., equal to reference ground voltage) through the first inverting circuit 110, and the output buffer 140 generates effective reset signal PORRST of logic high level.

Please note that if the power voltage VDD rises too fast from the first voltage to normal voltage level, based on the embodiment of the disclosure, the charging apparatus 130 performs charging operation on the voltage detection end NODE0 along with the rising operation of power voltage VDD, and makes the voltage on the voltage detection end NODE0 to be risen rapidly. In this manner, it can be avoided that the voltage on the voltage detection end NODE0 cannot be risen in time, thereby preventing the risk that the reset signal PORRST of logic high level cannot be effectively generated.

Figure 2:
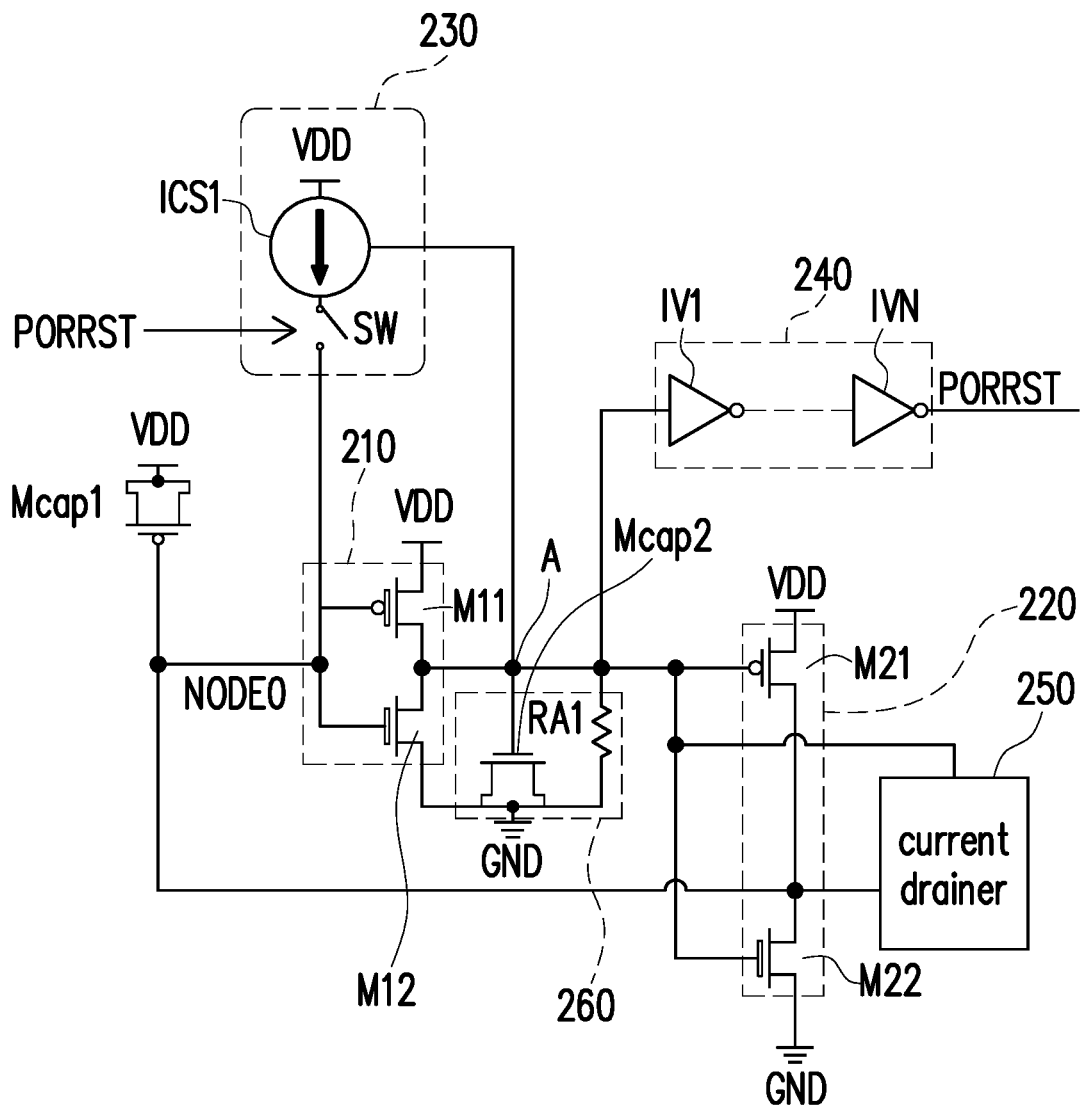
FIG. 2 is a schematic circuit diagram of a power on reset circuit according to another embodiment of the disclosure.

Referring to FIG. 2, which illustrates a schematic circuit diagram of a power on reset circuit according to another embodiment of the disclosure. A power on reset circuit 200 includes a first inverting circuit 210, a second inverting circuit 220, a current drainer 250, a charging apparatus 230, an output buffer 240, a capacitor Mcap1 and a resistor-capacitor (RC) circuit 260. An input end of the first inverting circuit 210 is coupled to a voltage detection end NODE0, and an output end of the first inverting circuit 210 is coupled to a signal control end A. The RC circuit 260 is coupled between the signal control end A and reference ground end GND. An input end of the second inverting circuit 220 is coupled to the signal control end A, and an output end of the second inverting circuit 220 is coupled to the voltage detection end NODE0. The current drainer 250 receives the power voltage VDD and the voltage on the signal control end A, and is coupled to the voltage detection end NODE0. The output buffer 240 is coupled to the signal control end A. The charging apparatus 230 is coupled to the voltage detection end NODE0, and the capacitor Mcap1 is coupled between the power voltage VDD and the voltage detection end NODE0.

In the embodiment, the first inverting circuit 210 includes transistors M11 and M12. A first end of the transistor M11 receives power voltage VDD, a second end of the transistor M11 is coupled to a first end of the transistor M12 and forms an output end of the first inverting circuit 210, wherein the output end of the first inverting circuit 210 is coupled to the signal control end A. Furthermore, the control ends of the transistor M11 and M12 are mutually coupled to the voltage detection end NODE0 and form an input end of the first inverting circuit 210.

The RC circuit 260 includes a capacitor Mcap2 and a resistor RA1. The capacitor Mcap2 may be a transistor capacitor and connected in series between the signal control end A and the reference ground end GND. The resistor RA1 and the capacitor Mcap2 are coupled in parallel. The capacitor Mcap2 may perform regulating and filtering operations on the voltage on the signal control end A, and the resistor RA1 may provide a discharging path of the signal control end A with respect to the reference ground end GND.

The second inverting circuit 220 includes transistors M21 and M22. A first end of the transistor M21 receives power voltage VDD, and a second end of the transistor M21 is coupled to a first end of the transistor M22 and forms an output end of the second inverting circuit 220, wherein the output end of the second inverting circuit 220 is coupled to the voltage detection end NODE0. Moreover, the control ends of the transistors M21 and M22 are mutually coupled to the signal control end A, and form an input end of the second inverting circuit 220.

The charging apparatus 230 includes a current source ICS1 and a switch SW. The current source ICS1 and the switch SW are connected in series, and connected in series between the power voltage VDD and the voltage detection end NODE0. The current source ICS1 is also coupled to the signal control end A, generates a charging current according to the voltage on the signal control end A, and provides charging current through the switch SW to charge the voltage detection end NODE0. It should be mentioned that the current source ICS1 may generate charging current to charge the voltage detection end NODE0 when the voltage on the signal control end A is relatively low voltage.

The switch SW is subject to the reset signal PORRST, and is closed when the reset signal PORRST is logic low level. Relatively, when the reset signal PORRST is logic high level, the switch SW is opened. In the embodiment, the switch SW may be construed through P-type transistor.

The output buffer 240 may be constructed through one or more inverters IV1-IVN, wherein the inverters IV1-IVN are connected in series. An input end of a first stage inverter IV1 is coupled to the signal control end A, the output buffer 240 generates the reset signal PORRST on an output end of the final stage inverter IVN through the voltage on the opposite signal control end A.

The disclosure provides no limitation to the number of the inverter(s) in the output buffer 240. In the embodiment of the disclosure, based on that the reset signal PORRST is opposite to the voltage on the signal control end A, the number of the inverters in the output buffer 240 may be odd number.

In the embodiment, the capacitors Mcap1 and Mcap2 are both transistor capacitors. Certainly, in other embodiments of the disclosure, the capacitors Mcap1 and Mcap2 may be constructed in random forms with the materials familiar to persons of ordinary skill in the art, the disclosure provides not particular limitation thereto. Moreover, the transistors M11 and M21 in the embodiment may be a P-type transistor, and the transistors M12 and M22 may be N-type transistors.

Figure 3:
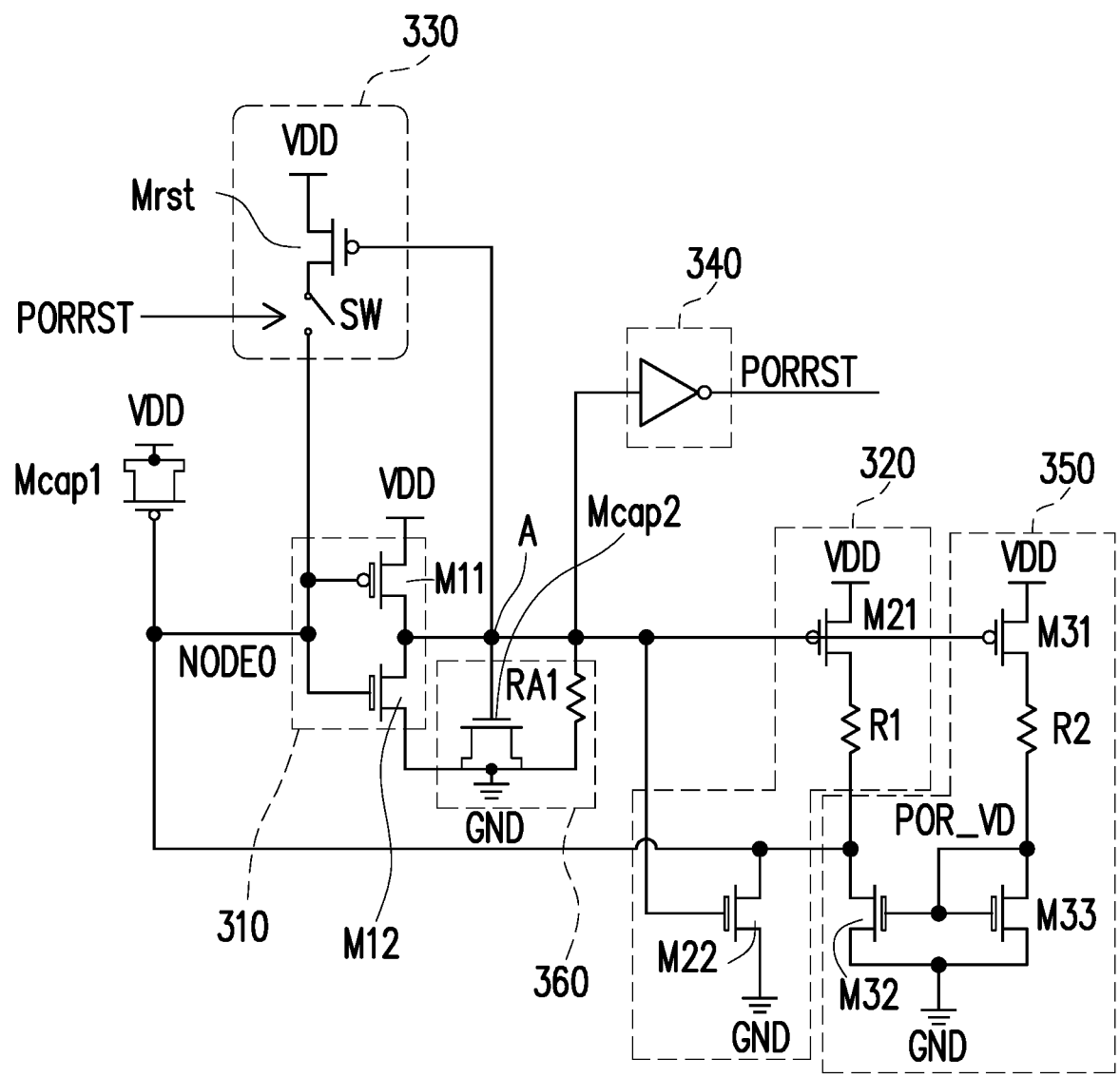
FIG. 3 is a schematic circuit diagram of a power on reset circuit according to yet another embodiment of the disclosure.

Referring to FIG. 3, which illustrates a schematic circuit diagram of a power on reset circuit according to yet another embodiment of the disclosure. A power on reset circuit 300 includes a first inverting circuit 310, a second inverting circuit 320, a current drainer 350, a charging apparatus 330, an output buffer 340, a capacitor Mcap1 and a RC circuit 360. It should be noted that, in the embodiment, the charging apparatus 330 includes a transistor Mrst to construct current source. The current drainer 350 includes transistors M31-M33.

In the embodiment, a first end of the transistor M31 receives power voltage VDD, a second end of the transistor M31 is connected to a first end of the transistor M33. The transistors M32 and M33 are coupled to form a circuit configuration of current mirror. Specifically, a first end of the transistor M32 is coupled to the voltage detection end NODE0, and may perform current draining operation on the voltage detection end NODE0. It should be mentioned that, in the embodiment, a resistor R1 is connected in series on a coupling path between the second end of the transistor M21 and the first end of the transistor M22, a resistor R2 is connected in series on a coupling path between the second end of the transistor M31 and the first end of the transistor M33.

The transistors M32 and M33 are coupled to the current mirror and generates draining current according to the magnitude of bias voltage POR_VD, and performs current draining operation on the voltage detection end NODE0. Specifically, the larger the bias voltage POR_VD, the larger the current value of the draining current.

Figure 4:
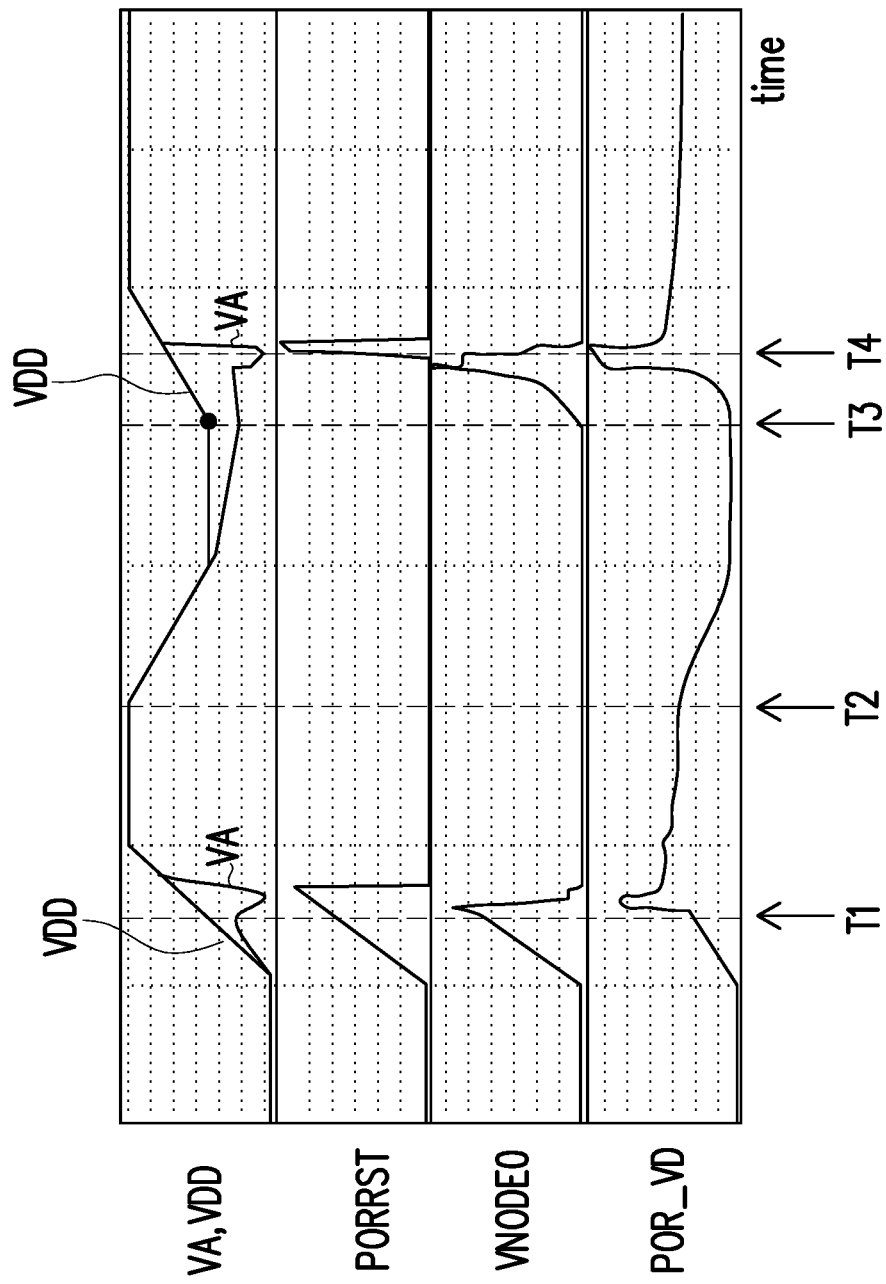
FIG. 4 is an operation waveform diagram of a power on reset circuit according to an embodiment of the disclosure.

Regarding the details of operation of the power on reset circuit 300, please refer to both of FIG. 3 and FIG. 4, FIG. 4 is an operation waveform diagram of a power on reset circuit according to an embodiment of the disclosure. A time point T1, the power voltage VDD is risen from the reference ground voltage, corresponding to which the voltage VA and the VNODE0 on the signal control end A and the voltage detection end NODE0 are risen along with the increased power voltage VDD. Moreover, the output buffer 340 generates the reset signal PORRST that is risen along with the increased power voltage VDD. It should be indicated that, at this time, the voltage VNODE0 is affected by the charging operation performed by the charging apparatus 330, and thus the voltage VNODE0 may be risen rapidly; after time point T1, since the voltage VNODE0 is increased to be a threshold voltage larger than the first inverting circuit 310, the voltage VA is decreased.

Corresponding to the decreasing operation of the voltage VA, the reset signal PORRST is raised to high logic level after the time point T1. Meanwhile, the reset signal PORRST causes the switch SW in the charging apparatus 330 to be opened to interpret the charging operation of the charging apparatus 330. Moreover, the current drainer 350 generates bias voltage POR_VD according to voltage VA of low voltage. Along with the increased bias voltage POR_VD, the transistor M32 provides the capability of draining current from the voltage detection end NODE0, and causes the voltage VNODE0 on the voltage detection end NODE0 to be dropped rapidly.

Along with decrease of the voltage VNODE0, the first inverting circuit 310 may make the voltage VA on the signal control end A to be risen. Moreover, the output buffer 340 may make the reset signal PORRST to be decreased to low logic level according to the increased voltage.

Moreover, at time point T2, the power voltage VDD starts to drop. At this time, the voltage VA on the signal control end A is dropped along with the decreased power voltage VDD. The power voltage VDD stops decreasing after being dropped to a fixed level, and starts to increase at time point T3. At time point T3, the voltage VNODE0 on the voltage detection end NODE0 is risen along with increased power voltage VDD, and through the charging operation of the charging apparatus 330, the voltage VNODE0 on the voltage detection end NODE0 is risen rapidly, which causes the voltage VA on the signal control end A to be dropped rapidly. In this manner, the output buffer 340 may generate the reset signal PORRST of high logic level at time point T4. In other words, the power on reset circuit 300 may generate effective reset signal. PORRST.

Please note that, after time point T3, the charging operation performed by the charging apparatus 330 enables the voltage VNODE0 on the voltage detection end NODE0 to rise at a faster speed. Accordingly, even if the power voltage VDD is risen too fast, the voltage VA on the signal control end can be decreased in time while generating effective reset signal PORRST.

In summary, with the power on reset circuit of the disclosure, through the charging apparatus that performs charging operation on the voltage on the voltage detection end in the process that the power voltage is decreased and increased again, the rising speed of the voltage on the voltage detection end is accelerated. In this manner, the output buffer can effectively generate pulse wave (e.g., positive pulse wave) of the reset signal and effectively reset the logic circuit in the integrated circuit, thereby maintaining normal operation of the integrated circuit.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A power on reset circuit, comprising:
    a first inverting circuit, having an input end directly connected to a voltage detection end, an output end of the first inverting circuit directly connected to a signal control end;
    a second inverting circuit, having an input end directly connected to the signal control end, the second inverting circuit having an output end directly connected to the voltage detection end;
    a current drainer, directly connected to the voltage detection end, draining a current from the voltage detection end according to a power voltage and a voltage on the signal control end;
    a charging apparatus, directly connected to the voltage detection end, charging the voltage detection end according to the voltage on the signal control end;
    an output buffer, directly connected to the signal control end, and generating a reset signal according to the voltage on the signal control end; and a first capacitor, directly connected between the voltage detection end and the power voltage.

2. The power on reset circuit as claimed in claim 1, further comprising:
a resistor-capacitor (RC) circuit, coupled between the signal control end and a reference ground end.

3. The power on reset circuit as claimed in claim 2, wherein the RC circuit comprises:
a second capacitor, connected in series between the signal control end and the reference ground end; and
a first resistor, connected in series between the signal control end and the reference ground end.

4. The power on reset circuit as claimed in claim 1, wherein when the power voltage is dropped at a first time segment, the voltage on the signal control end is dropped correspondingly, when the power voltage is risen in a second time segment, the charging apparatus charges the voltage detection end such that the voltage on the signal control end is decreased and the output buffer generates the reset signal of high voltage level,
wherein the first time segment is prior to the second time segment.

5. The power on reset circuit as claimed in claim 1, wherein the charging apparatus comprises:
a current source, coupled between the power voltage and the voltage detection end, providing a charging current to charge the voltage detection end according to the voltage on the signal control end; and
a switch, coupled to the current source in series between the power voltage and the voltage detection end, subject to the reset signal to be closed or opened.

6. The power on reset circuit as claimed in claim 5, wherein the current source comprises a transistor, a first end of the transistor receives the power voltage, a second end of the transistor is coupled to the voltage detection end, a control end of the transistor is coupled to the signal control end.

7. The power on reset circuit as claimed in claim 1, wherein the first inverting circuit comprises:
a first transistor, a first end thereof coupled to the charging apparatus, a second end of the first transistor coupled to the signal control end, a control end of the first transistor coupled to the voltage detection end; and
a second transistor, a first end thereof coupled to the signal control end, a second end of the second transistor coupled to the reference ground end, a control end of the second transistor coupled to the voltage detection end.

8. The power on reset circuit as claimed in claim 1, wherein the second inverting circuit comprises:
a first transistor, a first end thereof receiving the power voltage, a control end of the first transistor coupled to the signal control end; and
a second transistor, a first end thereof receiving a second end of the first transistor, a control end of the second transistor coupled to the signal control end, a second end of the second transistor coupled to the reference ground end.

9. The power on reset circuit as claimed in claim 8, wherein the current drainer comprises:
a third transistor, a first end thereof receiving the power voltage, a control end of the third transistor coupled to the signal control end;
a fourth transistor, a first end and a control end thereof mutually coupled to a second end of the third transistor, a second end of the fourth transistor coupled to the reference ground end; and
a fifth transistor, a first end thereof coupled to a second end of the first transistor, a control end of the fifth transistor coupled to a control end of the fourth transistor, a second end of the fifth transistor coupled to the reference ground end.

10. The power on reset circuit as claimed in claim 9, wherein the second inverting circuit further comprises:
a first resistor, connected in series on a coupling path between the second end of the first transistor and the first end of the fifth transistor;
the current drainer further comprising:
a second resistor, connected in series on a coupling path between the second end of the third transistor and the first end of the fourth transistor.

11. The power on reset circuit as claimed in claim 1, wherein the first capacitor is a transistor capacitor.

12. The power on reset circuit as claimed in claim 1, wherein the output buffer comprises at least one inverter, the input end of the at least one inverter is coupled to the signal control end, the output end of the at least one inverter generates the reset signal.

13. The power on reset circuit as claimed in claim 12, wherein the number of the at least one inverter in the output buffer is odd number.

* * * * *